United States Patent
Kondo et al.

(10) Patent No.: US 7,913,507 B2
(45) Date of Patent: Mar. 29, 2011

(54) ELECTRONIC EQUIPMENT COOLING SYSTEM

(75) Inventors: Yoshihiro Kondo, Tsuchiura (JP); Tatsuya Saito, Kunitachi (JP); Takeshi Kato, Akishima (JP); Kenji Ogiro, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 336 days.

(21) Appl. No.: 12/137,659

(22) Filed: Jun. 12, 2008

(65) Prior Publication Data

US 2009/0000332 A1  Jan. 1, 2009

(30) Foreign Application Priority Data

Jun. 15, 2007  (JP) ................. 2007-158891

(51) Int. Cl.
*F25D 23/12* (2006.01)
(52) U.S. Cl. ......................... 62/259.2; 62/509
(58) Field of Classification Search ............... 62/259.2, 62/509, 121, 304; 165/80.4, 104.33, 104.34; 261/26, 28; 361/688, 694, 699, 704
See application file for complete search history.

(56) References Cited

U.S. PATENT DOCUMENTS

| | | | |
|---|---|---|---|
| 5,485,671 A * | 1/1996 | Larson et al. | 29/890.032 |
| 5,943,211 A * | 8/1999 | Havey et al. | 361/699 |
| 6,064,572 A * | 5/2000 | Remsburg | 361/700 |
| 6,766,817 B2 | 7/2004 | Da Silva | |
| 6,918,404 B2 | 7/2005 | Da Silva | |
| 6,942,018 B2 * | 9/2005 | Goodson et al. | 165/80.4 |
| 6,988,534 B2 * | 1/2006 | Kenny et al. | 165/80.4 |
| 6,994,151 B2 * | 2/2006 | Zhou et al. | 165/80.4 |
| 7,066,586 B2 | 6/2006 | Da Silva | |
| 2004/0188065 A1 * | 9/2004 | Shook et al. | 165/80.4 |
| 2005/0178529 A1 * | 8/2005 | Suzuki | 165/80.4 |
| 2005/0212121 A1 * | 9/2005 | Ravi et al. | 257/712 |

FOREIGN PATENT DOCUMENTS

| | | |
|---|---|---|
| JP | 10-160368 | 6/1998 |
| JP | 11-26665 | 1/1999 |
| JP | 2005-228216 | 8/2005 |
| JP | 2006-308163 | 11/2006 |

OTHER PUBLICATIONS

Email from Elson Silva, dated Jan. 2, 2009, subject IDS request for US 20090000332.
JP Office Action of Appln. No. 2007-158891 dated Sep. 29, 2009 with English translation.
Email from Elson Silva, "[0453] Respecting Hydrology Science—US Patent Application 20090000332", dated Nov. 21, 2010.

* cited by examiner

*Primary Examiner* — Mohammad M Ali
(74) *Attorney, Agent, or Firm* — Antonelli, Terry, Stout & Kraus, LLP.

(57) ABSTRACT

An electronic equipment cooling system of the invention comprises: a heat receiver; a closed refrigerant circulation path (including: the heat receiver; a refrigerant condenser; a refrigerant pump; and a refrigerant tank); and a closed gas circulation path (including: the heat receiver; the refrigerant condenser; and a blower). The heat receiver includes: a heat receiver base contacting a heat generating component; a box; a gas flow space surrounded by the heat receiver base and box; a refrigerant inlet through which a liquid refrigerant dribbles down along an internal surface of the heat receiver base; a liquid refrigerant spreader used for spreading the liquid refrigerant thereacross and having a mesh portion with an opening for passing a vapor of the refrigerant into the gas flow space; a gas inlet through which a gas is fed from the blower; and a gas outlet for venting the gas containing the vapor of the refrigerant.

7 Claims, 5 Drawing Sheets

ELECTRONIC EQUIPMENT COOLING SYSTEM

CLAIM OF PRIORITY

The present application claims priority from Japanese patent application serial no. 2007-158891 filed on Jun. 15, 2007, the content of which is hereby incorporated by reference into this application.

BACKGROUND OF THE INVENTION

1. Field of the Invention

The present invention relates to cooling systems for cooling heat generating components in electronic equipment (electronics). It particularly relates to cooling systems which efficiently and stably cool heat generating components by utilizing the latent heat of vaporization of a liquid refrigerant while circulating the refrigerant.

2. Description of Related Art

Semiconductor devices such as CPUs (central processing units) in electronic equipment (electronics) typified by computers need to be temperature controlled (mostly by cooling) from the standpoint of performance stabilization and failure prevention of such electronic equipment. Conventionally, there have been generally employed a passive cooling system which regulates the air temperature surrounding electronic equipment using an air conditioner or the like, and cools the electronic equipment by utilizing heat dissipating fins attached to devices such as CPUs and ventilation fans. With recent trend toward higher packing densities and higher operation speeds, semiconductor devices generate more and more heat. There is also a demand for downsizing of electronic equipment, so active cooling systems for heat generating components in electronic equipment are receiving much attention today.

For example, JP-A-2005-228216 discloses a method of direct liquid cooling for heat generating components in electronic equipment, in which heat is directly transferred from the components to a liquid refrigerant used as heat exchange medium. JP-A Hei 10 (1998)-160368 and JP-A-2006-308163 disclose a method for downsizing a cooling system by utilizing a loop heat pipe.

However, the above-mentioned conventional methods have technical problems to be solved. In order to efficiently liquid cool semiconductor devices such as CPUs mounted on various blade modules of electronic equipment, the cooling system of the above-mentioned JP-A-2005-228216 is configured with: multiple cooling units for liquid cooling the respective blade modules; and a heat exchange unit for venting heated liquid refrigerants from the respective cooling units, cooling them with a heat exchanger and redistributing them to the multiple cooling units. This patent describes that efficient cooling can be achieved by regulating the flow rates of the liquid refrigerants distributed from the heat exchange unit to the cooling units. However, the cooling efficiency depends on the flow rate of liquid refrigerant and therefore a relatively large amount of liquid refrigerant is needed, thus possibly incurring an increase in the size of the liquid refrigerant feed pump and heat exchanger.

The heat pipe cooling system described in the above-mentioned JP-A Hei 10 (1998)-160368 uses a loop heat pipe in which the heat receiving and dissipating units and the piping connecting them are optimized in order to achieve downsizing and improved efficiency of the cooling system and to prevent dew formation (condensation) harmful to electronic components. This cooling system acquires a high cooling capacity by utilizing the latent heat of the working fluid of the heat pipe. However, because the circulating force is provided by difference in operating pressure between the heat receiving and dissipating units, the pumping force is by its nature small, so sufficient force for circulating the liquid refrigerant cannot be maintained in some situations (particularly at lower loads) Therefore, a pump is needed to overcome this problem. In addition, it is difficult to achieve a stable cooling capacity.

In order to improve the pumping force generated by the vaporization of the working liquid of the heat pipe, the cooling system of the above-mentioned JP-A-2006-308163 has, within the heat receiving container, multiple wicks each producing a capillary pressure by impregnating it with the working liquid. Each wick is a porous structure having a number of pores. And, there is provided a laminate of multiple wicks having different pore sizes. The patent describes that wicks having different pore sizes have difference capillary pressures, generating a temperature gradient between the inside and outside of the laminate of wicks, and thus, the flow of the working fluid can be smoothened. However, similarly to the above-mentioned JP-A Hei 10 (1998)-160368, this patent still has a problem of small pumping force. Therefore, the pumping force cannot adequately respond to load changes, and thus a stable cooling capacity cannot be obtained.

SUMMARY OF THE INVENTION

Under these circumstances, it is an objective of the present invention to provide an electronic equipment cooling system which can efficiently and stably cool heat generating components in electronic equipment even when the temperature of such components changes (due to a change in the load of the equipment).

According to one aspect of the present invention, there is provided a cooling system for cooling a heat generating component in electronic equipment, which comprises:
  a heat receiver thermally connected to the heat generating component, the heat receiver including:
    a heat receiver base contacting the heat generating component and having a substantially flat surface;
    a box;
    a gas flow space surrounded by the heat receiver base and box;
    a liquid refrigerant inlet through which a liquid refrigerant dribbles down along an internal surface of the heat receiver base on the side of the gas flow space;
    a liquid refrigerant spreader for spreading the liquid refrigerant thereacross to form a film, the spreader having a mesh portion with an opening for passing a vapor of the refrigerant and releasing the vapor into the gas flow space;
    a gas inlet through which a gas used for vaporizing the refrigerant is fed from a blower; and
    a gas outlet for venting, from the gas flow space, the gas containing the vapor released from the spreader;
  a closed refrigerant circulation path, including:
    the heat receiver;
    a refrigerant condenser;
    a refrigerant pump; and
    a refrigerant tank; and
  a closed gas circulation path, including:
    the heat receiver;
    the refrigerant condenser; and
    the blower.

In the above aspect of the present invention, the following modifications and changes can be made.

(i) The liquid refrigerant spreader is disposed along a substantially entire area of the internal surface of the heat receiver base.

(ii) The size of the opening of the mesh portion of the liquid refrigerant spreader is from 0.2 to 1.8 mm.

(iii) The mesh portion of the liquid refrigerant spreader is a plain weave of metal wires with a diameter of 0.2 to 0.5 mm.

(iv) The liquid refrigerant spreader further includes a cutout portion facing a semiconductor chip mounted on the heat generating component and having substantially the same projected shape as that of the semiconductor chip.

(v) The distance between the internal surface of the heat receiver base and a surface of the mesh portion of the spreader remote from the heat receiver base is from 1 to 1.5 mm.

(vi) The temperature of the gas fed into the heat receiver is controlled, by means of a temperature control mechanism, to be higher than that of the liquid refrigerant dribbling down along the internal surface of the heat receiver base.

ADVANTAGES OF THE INVENTION

The electronic equipment cooling system according to the present invention has a closed refrigerant circulation path and a closed gas circulation path separately from each other, and also makes active use of the latent heat of vaporization of a liquid refrigerant while circulating the refrigerant; thereby it can offer an efficient and stable cooling capacity even if the temperature of heat generating components in electronic equipment changes (due to a change in the load of the equipment).

DETAILED DESCRIPTION OF THE PREFERRED EMBODIMENTS

A preferred embodiment of the present invention will be described below with reference to the accompanying drawings. However, the present invention is not limited to the embodiment described herein.

First Embodiment of the Invention (Overall Structure of Electronic Equipment Cooling System)

Figure 1:
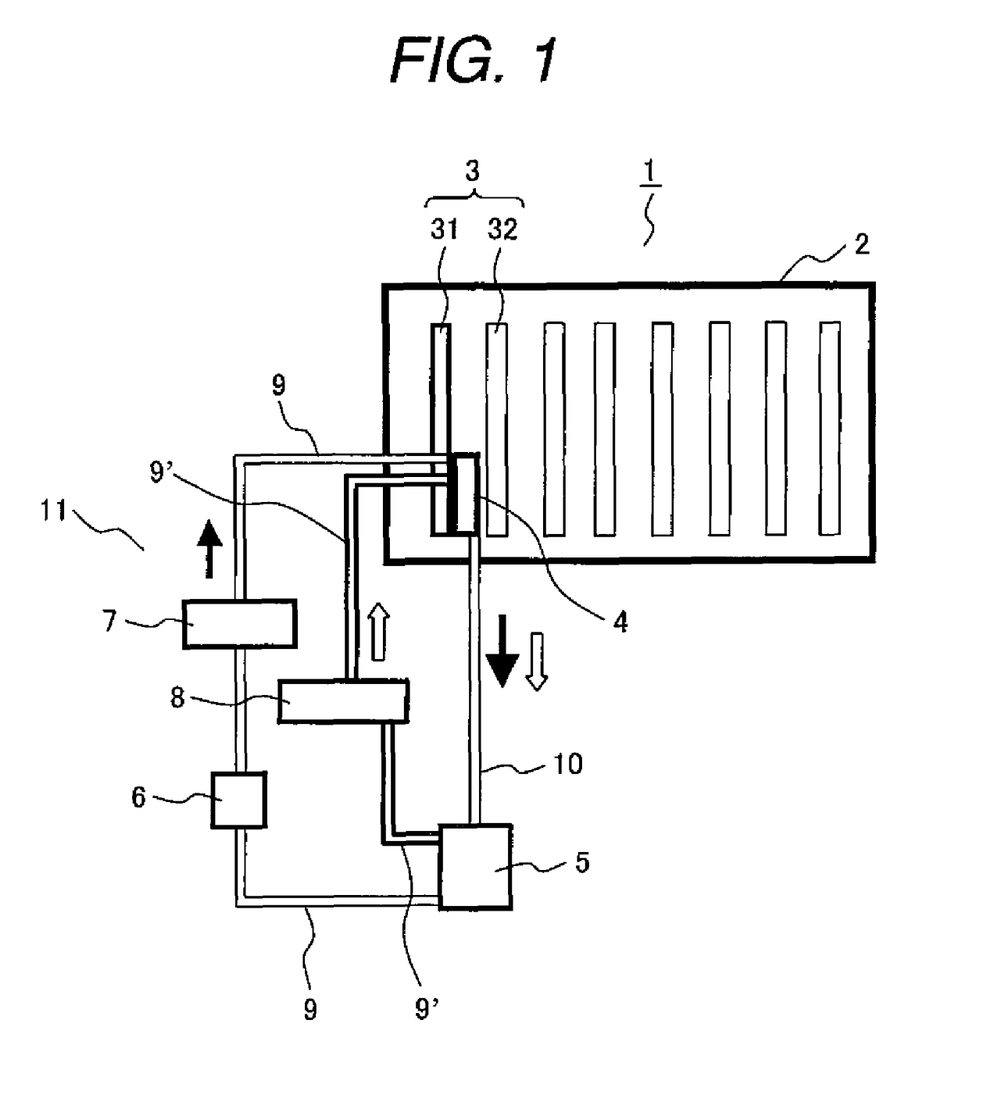
FIG. 1 is a schematic illustration showing an overall structure of an exemplary electronic equipment cooling system according to the present invention.

FIG. 1 is a schematic illustration showing an overall structure of an exemplary electronic equipment cooling system according to the present invention. Electronic equipment 1 is, for example, a blade server, which includes multiple blade modules 3 having mounted thereon heat generating components such as a CPU; and a cabinet 2 for housing the modules 3. There are various types of blade modules 3 such as a server blade 31 having CPUs and a peripheral blade 32 having other devices such as network peripherals. And, each blade module 3 has mounted thereon various heat generating components of different heat generation levels. Each blade module 3 may be provided with its own cooling system 11, or alternatively a single cooling system 11 may be branched to serve multiple blade modules 3.

Examples of the electronic equipment 1 include, besides the blade server, mainframes, supercomputers and network systems. While this embodiment will be described below for the case of cooling a server blade 31 having high heat generating components such as CPUs, the electronic equipment to be cooled is not limited to a server blade 31, or the heat generating component to be cooled is not limited to a CPU.

In the cooling system 11 of the present invention, there is provided a closed refrigerant circulation path which is formed by connecting, using refrigerant conduits 9, a heat receiver 4 thermally connected to a heat generating component of the electronic equipment, a refrigerant condenser 5, a refrigerant pump 6, and a refrigerant tank 7. Further, a closed gas circulation path is formed by connecting, using gas conduits 9', the heat receiver 4, the refrigerant condenser 5 and a blower 8. The heat receiver 4 and refrigerant condenser 5 are connected by a common conduit 10, through which a gas containing a vaporized refrigerant (i.e., a mixture of a refrigerant and gas) flows. Moreover, the refrigerant condenser 5 is indirectly connected to an external heat exchanger (not shown).

In FIG. 1, black and open arrows indicate the flows of the refrigerant and gas, respectively. The refrigerant is stored in the refrigerant tank 7 and fed into the heat receiver 4 with the refrigerant pump 6. And, the blower 8 feeds the gas (e.g., dry air) used for vaporizing the refrigerant into the heat receiver 4. While the following description will be made for the case of using pure water as a representative of the refrigerant, other refrigerants such as ethanol, methanol and fluorinert (trademark, perfluorinated liquid, available from Sumitomo 3M Limited) may be employed (differences between different refrigerant cases are not detailed).

The vaporization of the liquid refrigerant in the heat receiver 4 is prompted by heat transfer from the heat generating component and diffusion toward the feed gas, thereby efficiently cooling the heat generating component. The refrigerant vaporized is mixed with the feed gas and the resulting mixed gas (e.g., the gas humidified with water) is vented to the refrigerant condenser 5 through the common conduit 10.

The refrigerant condenser 5, which is configured (as described above) to transfer heat to the unshown heat exchanger, condenses the gaseous refrigerant vented from the heat receiver 4 so that the liquid refrigerant and gas are separated from the mixture. The liquid refrigerant so separated is pumped back to the refrigerant tank 7 with the refrigerant pump 6. And, the gas so separated (dry gas) is recirculated with the blower 8.

(Structure of Heat Receiver)

Figure 2:
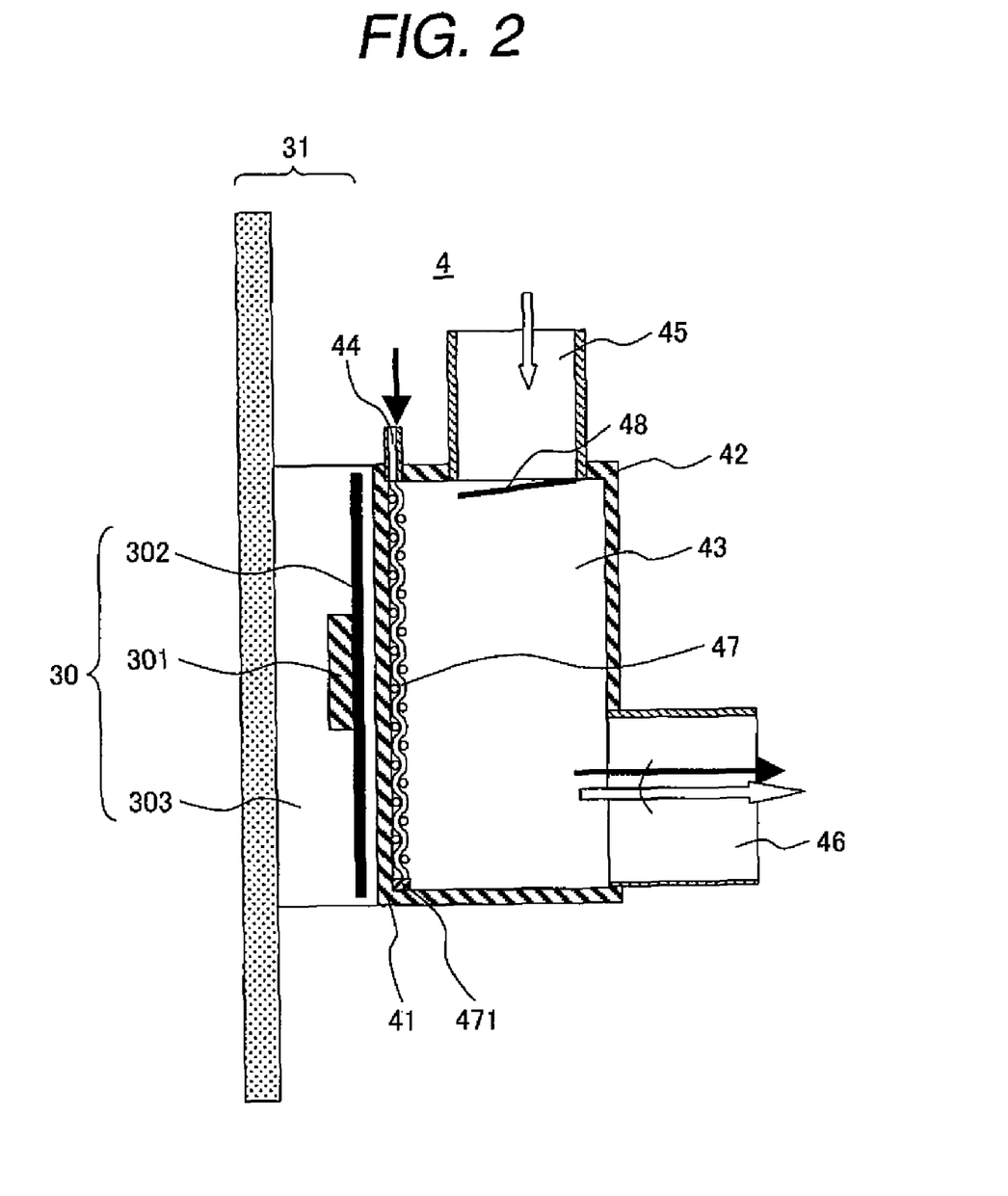
FIG. 2 is a schematic illustration showing a cross-sectional view of an exemplary heat receiver used in an electronic equipment cooling system of the present invention.

The structure of the heat receiver 4 will now be described in more detail. FIG. 2 is a schematic illustration showing a cross-sectional view of an exemplary heat receiver used in the electronic equipment cooling system of the present invention. As shown in FIG. 2, the heat receiver 4 includes a heat receiver base 41 having a substantially flat surface and a box 42. And, there is formed a gas flow space 43 surrounded by the base 41 and box 42. The heat receiver base 41 is preferably made of a good heat-conducting metal (such as copper and aluminum), and thermally contacts a heat generating component 30 mounted on a blade module substrate. In addition, the heat receiver base 41 preferably has substantially the same projected shape (area) as that of a single heat generating component to be cooled, but it may cover all adjacently spaced heat generating components mounted on the blade module substrate. When the heat generating component 30 is a CPU, the component 30 includes a semiconductor chip 301, a heat spreader 302 and a resin mold 303.

In a upper portion of the top wall of the box 42, there is provided a liquid refrigerant inlet 44 through which the liquid refrigerant is fed and then dribbles down, by its own weight, along a surface of the heat receiver base 41 on the side of the gas flow space 43 (hereinafter, the internal surface of the heat receiver base 41). In another upper portion of the top wall of the box 42, there is provided a gas inlet 45 through which the gas (e.g., dry air) used for vaporizing the refrigerant is fed into the gas flow space 43. Further, the box 42 is provided with a gas outlet 46 for venting together: the refrigerant vaporized by heat transfer from the heat generating component 30 and released into the feed gas; the liquid refrigerant which has dribbled down along the internal surface of the heat receiver base and reached the bottom of the wall 42; and the feed gas. Again in FIG. 2, black and open arrows indicate the flows of the refrigerant and gas, respectively. In FIG. 2, the gas inlet 45 is provided next to the refrigerant inlet 44 and the gas outlet 46 is provided in a lower portion of the side wall of the box 42 opposing the heat receiver base 41. However, the locations are not limited to those shown in the figure as long as the feed gas can efficiently prompt the vaporization of the liquid refrigerant, and also the refrigerant and feed gas can be efficiently vented. In addition, the gas inlet 45 is preferably provided with a backflow preventer 48 (such as a check valve) in order to suppress the backflow of the gas.

The cooling capability of the cooling system of the present invention depends on the efficiency of vaporization of the liquid refrigerant on the internal surface of the heat receiver base. For efficient vaporization of the liquid refrigerant, it is desirable to spread the dribbling liquid refrigerant thinly over the entire internal surface of the heat receiver base. For this purpose, a liquid refrigerant spreader 47 is provided along the internal surface of the heat receiver base of the heat receiver 4. Preferably, the liquid refrigerant spreader 47 is provided along substantially the entire area of the internal surface of the heat receiver base. The liquid refrigerant spreader 47 has its own fine openings and/or it has a small gap between itself and the internal surface of the heat receiver base. Here, such fine openings and/or such a small gap function to cause, by capillary phenomenon, the liquid refrigerant fed from the inlet 44 to spread over substantially the entire internal surface of the heat receiver base and to form a film. In addition, the liquid refrigerant so spread in a film dribbles down very slowly, while occasionally staying, by surface tension, on the spreader 47 and internal surface of the heat receiver base. Preferably, the internal surface of the heat receiver base is applied a hydrophilic treatment (such as a hydrophilic titanium oxide coating) in order to improve wettability to the liquid refrigerant.

(Structure of Liquid Refrigerant Spreader)

Figure 3:
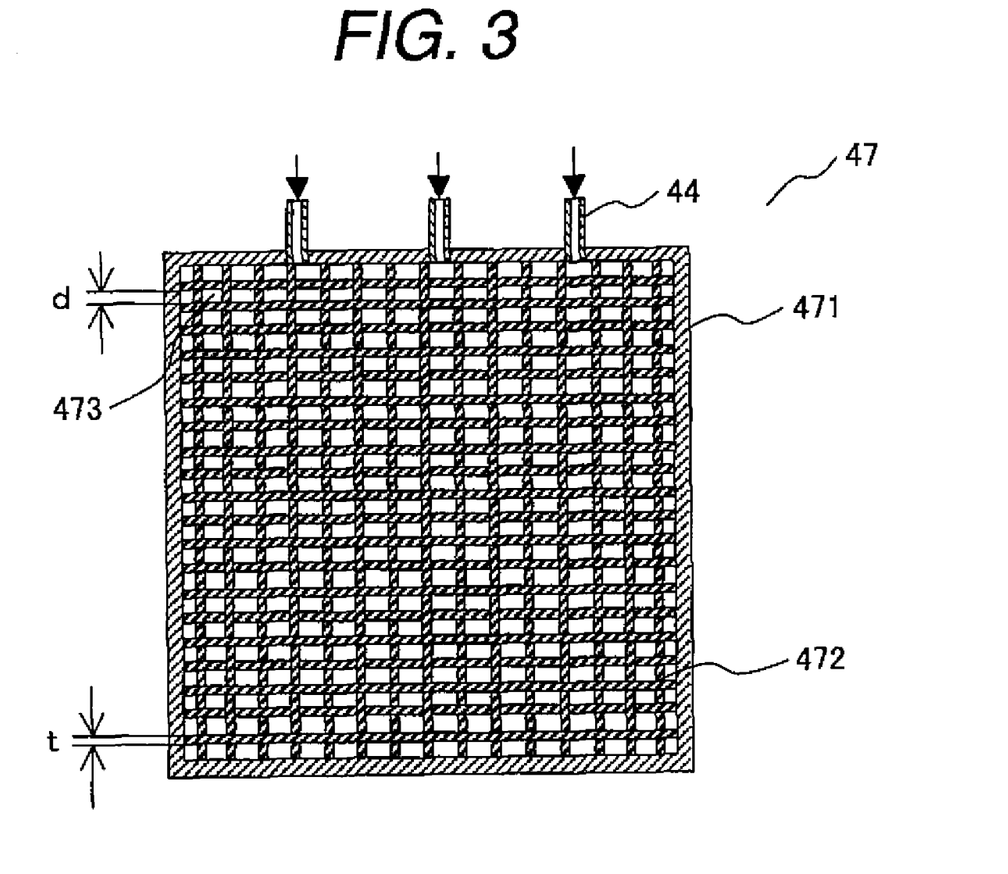
FIG. 3 is a schematic illustration showing a plane view of an exemplary liquid refrigerant spreader according to a first embodiment of the present invention.

Next, the structure of the liquid refrigerant spreader 47 will be described. FIG. 3 is a schematic illustration showing a plane view of an example of the liquid refrigerant spreader according to the first embodiment of the present invention. The liquid refrigerant spreader 47 includes: an outer frame 471 having substantially the same shape as the outer periphery of the internal surface of the heat receiver base; and a mesh 472 of intersecting wires with a diameter t (mm) fitted within the frame 471. The mesh 472 has rectangle openings 473 with a side length d (mm). A plurality of refrigerant inlets 44 are provided in the top of the outer frame 471 in such a manner that the liquid refrigerant fed can infiltrate into the mesh 472. Then, the mesh openings 473 and/or the small gap between the mesh and internal surface of the heat receiver base cause, by capillary phenomenon, the infiltrating liquid refrigerant to spread across the entire area of the mesh 472.

The wire of the mesh 472 is preferably made of a good heat-conducting metal (such as copper and aluminum), but other materials may be used. Additionally, the mesh 472 is preferably a plain weave of wires with a diameter of 0.2 to 0.5 mm. Further, the mesh 472 is preferably applied a hydrophilic treatment (such as a hydrophilic titanium oxide coating) in order to improve wettability to the liquid refrigerant.

As already described, it is preferable that the internal surface of the heat receiver base is continuously and uniformly wetted (covered) by the liquid refrigerant. Here, it is important to maintain a film of the liquid refrigerant because formation of droplets will cause reduction in evaporation efficiency (which will be detailed later). In order to maintain such a film, the distance between the internal surface of the heat receiver base and the surface of the mesh remote from the heat receiver base is preferably the order of 1 to 1.5 mm.

Figure 4:
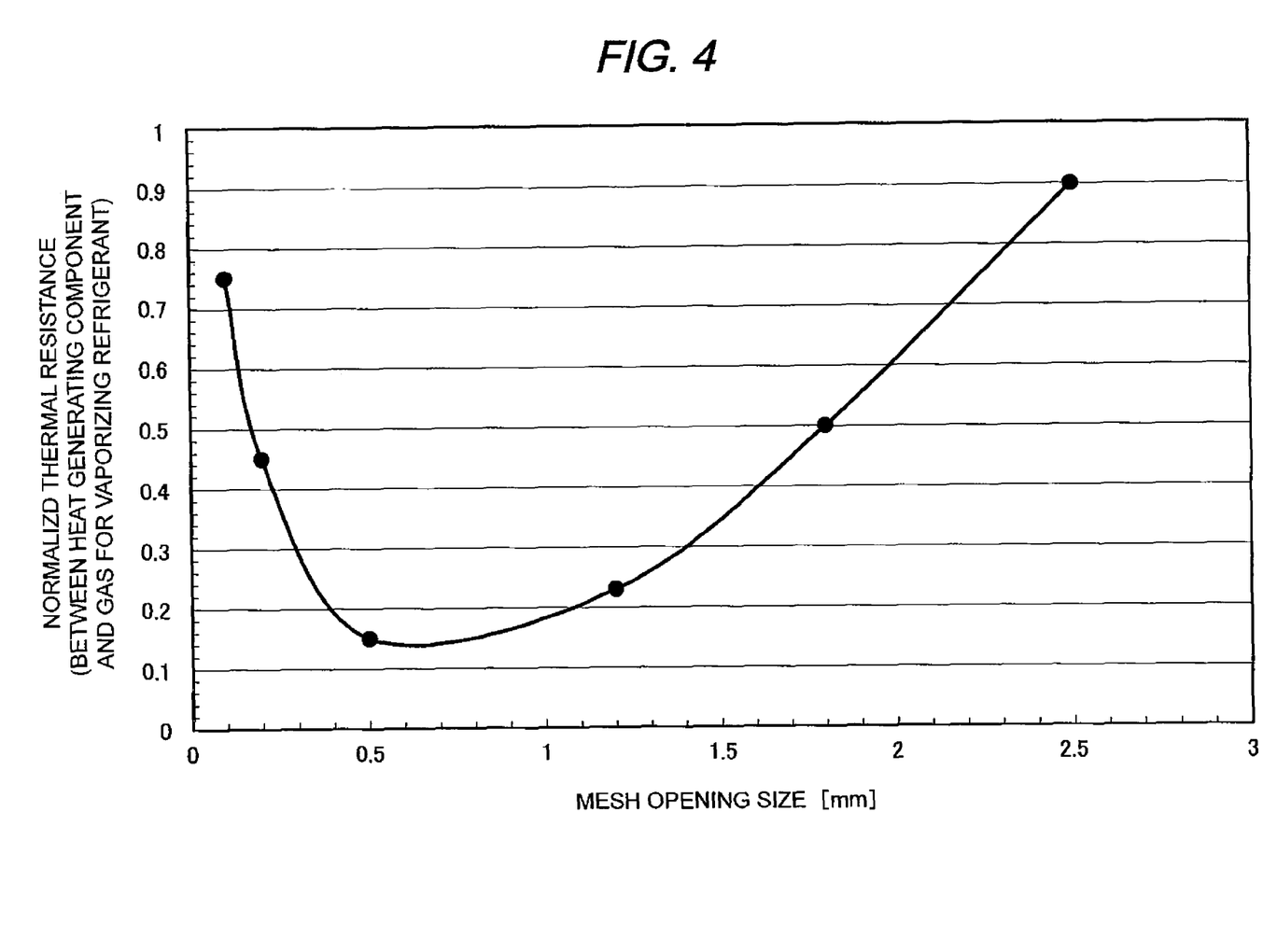
FIG. 4 is a graph showing a relationship between size of a mesh opening and normalized thermal resistance between a heat generating component and a gas used for vaporizing a refrigerant.

The refrigerant vaporized by heat transfer from the heat generating component and urged to diffuse to the feed gas passes through the mesh openings 473 of the mesh 472 and is released into the gas flow space 43 of the heat receiver 4. Here, the amount of the vaporized refrigerant passing through the mesh openings 473 depends strongly on the size of the opening 473. FIG. 4 shows the experimental result when pure water was used as the refrigerant. The conditions other than the size of the mesh opening were maintained constant. FIG. 4 is a graph showing a relationship between the size of the mesh opening and normalized thermal resistance between the heat generating component and the gas used for vaporizing the refrigerant. The "normalized thermal resistance" plotted along the ordinate means the thermal resistance normalized to that obtained without the mesh (or liquid refrigerant spreader).

As is apparent from FIG. 4, for the mesh opening with a side length of 0.2 to 1.8 mm, the thermal resistance between the heat generating component and the feed gas can be reduced to one half or less compared to the case without the liquid refrigerant spreader (i.e., the normalized thermal resistance can be reduced to 0.5 or less). A more preferable side length of the mesh opening is 0.3 to 1.4 mm, and thereby the specific thermal resistance can be reduced to 0.3 or less. An even more preferable side length of the mesh opening is 0.4 to 1.0 mm, and thereby the specific thermal resistance can be reduced to 0.2 or less.

(Discussion on Vaporization of Liquid Refrigerant)

Next, conditions required for vaporizing the liquid refrigerant and efficiently cooling the heat generating component will be discussed. For example, when the heat generating component 30 is a CPU having a thermal design power (TDP) of 80 W and pure water is used as the liquid refrigerant, the liquid refrigerant needs to be vaporized at a rate of approximately 2 g/min or more in order to dissipate heat generated by the CPU since the latent heat of vaporization of pure water is approximately 2390 J/g. It goes without saying that the required rate of vaporization of the liquid refrigerant varies depending on the heat generation level.

In order to acquire a sufficient amount of latent heat of vaporization required for cooling, it is more important to enhance the efficiency of vaporization of the liquid refrigerant than to increase the feed rate thereof to the heat receiver 4. The feed rate of the liquid refrigerant can be minimal as long as it can provide a sufficient liquid refrigerant required for the evaporative cooling. The efficiency of vaporization of the liquid refrigerant can be enhanced, for example, by increasing the temperature of the gas flow space 43 of the heat receiver 4 or by drying the feed gas. In other words, it is vital to provide and maintain a condition under which the gas flow space 43 can contain a sufficiently large amount of vaporized refrigerant (can have a sufficiently high saturated vapor pressure of the refrigerant). Preferably, in the present invention, a dry gas with a temperature higher than that of the liquid refrigerant is fed to the heat receiver 4 with the blower 8; thereby, a sufficiently large amount of vaporized refrigerant can be contained in the dry gas and can then be rapidly exhausted.

A method for maintaining an efficient vaporization of the liquid refrigerant will be further described. Assume that the liquid refrigerant, which is circulated and fed into the heat receiver 4, is provided with no special temperature control and is at room temperature (approximately 20° C.). Then, in order to stably operate the above-mentioned heat generating component having a TDP of 80 W at, for example, 60° C. (i.e., in order to maintain it at 60° C.), the refrigerant needs to be vaporized at 60° C. or below because the temperature thereof only rises from 20° C. to somewhere 60° C. or below).

The following two factors govern the rate of vaporization of liquid refrigerant:

(1) the diffusion of the vaporized refrigerant caused by a difference between the vapor pressure in the liquid refrigerant and the saturated vapor pressure in the feed gas, and (2) the mass transport of the vaporized refrigerant caused by the flow of the feed gas which vents the vaporized refrigerant.

In particular, the vaporization of the liquid refrigerant on the internal surface of the heat receiver base is governed by the above factor (1).

As described above, when pure water is used as the refrigerant, it needs to be vaporized at a rate of approximately 2 g/min in order to dissipate a heat generation of 80 W. In this case, considering the above governing factors and assuming that the average gas flow rate in the gas feed space 43 is approximately 3 m/sec, then the temperature of the feed gas is desirably about 30° C. or more. In order to raise the temperature of the feed gas to about 30° C. or more, it is preferable to provide the closed gas circulation path with a temperature control mechanism (such as a hot air generator and a heat exchanger utilizing heat generated by the heat generating components of the electronic equipment 1).

The vaporized refrigerant expands, passes through the mesh openings 473 of the mesh 472 and is released into the gas flow space 43 of the heat receiver 4. In addition, the vaporized refrigerant which has expanded and been released into the gas flow space 43 increases the pressure inside the space 43, and then a resulting pumping force facilitates the vaporized refrigerant and gas fed from the gas inlet 45 to be rapidly exhausted through the gas outlet 46. Furthermore, as has been already described, the gas inlet 45 is preferably provided with the backflow preventer 48 in order to inhibit the backflow of the mixed gas caused by the pressure increase due to the vaporization of refrigerant.

Second Embodiment of the Invention

A second embodiment of the present invention will now be described. The overall structure of the electronic equipment cooling system and structure of the heat receiver according to this embodiment are similar to those described in the first embodiment, and therefore the detailed descriptions are omitted.

Figure 5:
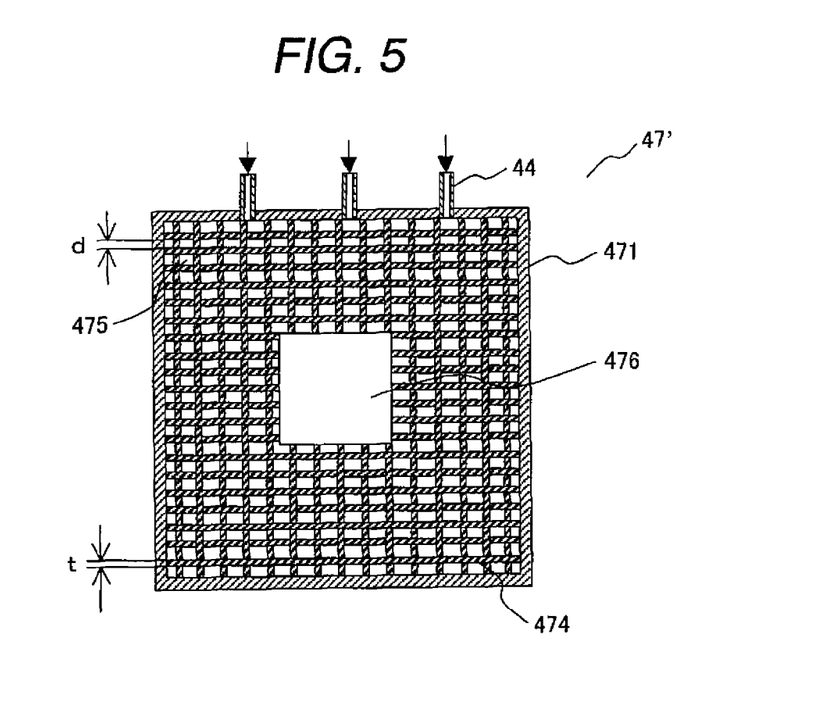
FIG. 5 is a schematic illustration showing a plane view of an exemplary liquid refrigerant spreader according to a second embodiment of the present invention.

FIG. 5 is a schematic illustration showing a plane view of an exemplary liquid refrigerant spreader according to the second embodiment of the present invention. Similarly to the first embodiment, a liquid refrigerant spreader 47' includes: the outer frame 471 having substantially the same shape as the outer periphery of the internal surface of the heat receiver base; and a mesh 474 of intersecting wires with a diameter t (mm) fitted within the frame 471. The mesh 474 has, in addition to rectangle openings 475 with a side length d (mm), a cutout 476 facing the semiconductor chip 301 of the heat generating component 30 and having substantially the same projected size as that of the chip 301. A plurality of refrigerant inlets 44 are provided in the top of the outer frame 471 in such a manner that the liquid refrigerant fed therethrough can infiltrate into the mesh 474. Then, the mesh openings 475 and/or a small gap between the mesh and internal surface of the heat receiver base cause, by capillary phenomenon, the infiltrating liquid refrigerant to spread across the entire area of the mesh 474.

Such a structure can further facilitate vaporization of the liquid refrigerant and is therefore particularly effective for heat generating components having a higher TDP (e.g., 100 W or more). The heat receiver having the mesh 474 with the cutout 476 was measured for the normalized thermal resistance between the heat generating component and the feed gas. The result showed that the normalized thermal resistance could be further reduced by about 10% compared to the case without the cutout 476 (as described in FIG. 3 of the first embodiment). Additionally, in this embodiment, the remaining portions of the mesh 474 other than the cutout 476 (i.e., the wire and opening 475 of the mesh 474) are the same as those described in the first embodiment.

Third Embodiment of the Invention

Next, a third embodiment of the present invention will be described. The overall structure of the electronic equipment cooling system and structure of the heat receiver according to this embodiment are similar to those described in the first embodiment, and therefore the detailed descriptions are omitted.

Figure 6:
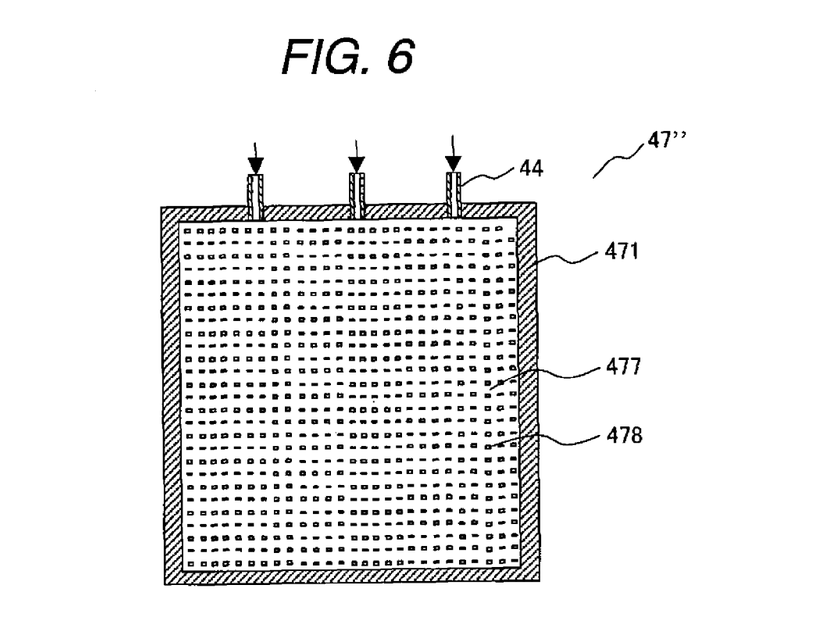
FIG. 6 is a schematic illustration showing a plane view of an exemplary liquid refrigerant spreader according to a third embodiment of the present invention.

FIG. 6 is a schematic illustration showing a plane view of an exemplary liquid refrigerant spreader according to the third embodiment of the present invention. A liquid refrigerant spreader 47" includes: the outer frame 471 having substantially the same shape as the outer periphery of the internal surface of the heat receiver base; and a mesh 477 formed of a plate within the frame 471. The mesh 477 has a number of openings 478. The shape of the opening 478 is not particularly limited, but preferably is rectangular or circular in terms of workability. Similarly to the first embodiment, the size of the opening 478 is preferably 0.2 to 1.8 mm.

A plurality of liquid refrigerant inlets 44 are provided in the top of the outer frame 471. The liquid refrigerant fed through the inlets 44 infiltrates into the mesh openings 478 and/or the small gap between the mesh 477 and internal surface of the heat receiver base, and then spreads across the entire area of the mesh 477 by capillary phenomenon. Preferably, the material and surface treatment of the mesh 477 are similar to those of the first embodiment.

The liquid refrigerant spreader 47" having such a structure offers advantages similar to the first embodiment. Moreover, advantages similar to the second embodiment can be obtained by forming, similarly to the second embodiment, a cutout 476 facing the semiconductor chip 301 of the heat generating component 30 and having substantially the same projected size as that of the chip 301.

Advantages of the Embodiments

The above-described embodiments of the present invention have advantages below.

(1) The electronic equipment cooling system according to the present invention can efficiently cool electronic equipment by making active use of the latent heat of vaporization of a liquid refrigerant while circulating the refrigerant.

(2) The electronic equipment cooling system according to the present invention makes active use of the latent heat of vaporization of a liquid refrigerant while circulating the refrigerant, thereby reducing the required amount of the refrigerant and therefore reducing the size of the cooling system compared to cooling systems employing conventional cooling methods.

(3) The electronic equipment cooling system according to the present invention maintains a film of a liquid refrigerant across a liquid refrigerant spreader provided in its heat receiver, thereby increasing the heat transfer and vaporization areas to the liquid refrigerant and therefore increasing the cooling efficiency compared to conventional cooling systems using a heat pipe.

(4) The electronic equipment cooling system according to the present invention provides a closed refrigerant circulation path and a closed gas circulation path separately from each other, and thereby the circulating (pumping) force can be maintained stable. Therefore, electronic equipment can be cooled stably even if the temperature of the heat generating components of the electronic equipment changes (due to a change in the load of the equipment).

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A cooling system for cooling a heat generating component in electronic equipment, comprising:
   a heat receiver thermally connected to the heat generating component, the heat receiver including:
      a heat receiver base contacting the heat generating component and having a substantially flat surface;
      a box;
      a gas flow space surrounded by the heat receiver base and box;
      a liquid refrigerant inlet through which a liquid refrigerant dribbles down along an internal surface of the heat receiver base on the side of the gas flow space;
      a liquid refrigerant spreader for spreading the liquid refrigerant thereacross to form a film, the spreader having a mesh portion with an opening for passing a vapor of the refrigerant and releasing the vapor into the gas flow space;
      a gas inlet through which a gas used for vaporizing the refrigerant is fed from a blower; and
      a gas outlet for venting, from the gas flow space, the gas containing the vapor released from the spreader;
   a closed refrigerant circulation path, including:
   the heat receiver;
      a refrigerant condenser;
      a refrigerant pump; and
      a refrigerant tank; and
   a closed gas circulation path, including:
      the heat receiver;
      the refrigerant condenser; and
      the blower.

2. The cooling system according to claim 1, wherein:
the liquid refrigerant spreader is disposed along a substantially entire area of the internal surface of the heat receiver base.

3. The cooling system according to claim 1, wherein:
the size of the opening of the mesh portion of the liquid refrigerant spreader is from 0.2 to 1.8 mm.

4. The cooling system according to claim 1, wherein:
the mesh portion of the liquid refrigerant spreader is a plain weave of metal wires with a diameter of 0.2 to 0.5 mm.

5. The cooling system according to claim 1, wherein:
the heat generating component includes a semiconductor chip, and the liquid refrigerant spreader further includes a cutout portion facing the semiconductor chip and having substantially the same projected shape as that of the semiconductor chip.

6. The cooling system according to claim 1, wherein:
the distance between the internal surface of the heat receiver base and a surface of the mesh portion of the spreader remote from the heat receiver base is from 1 to 1.5 mm.

7. The cooling system according to claim 1, wherein:
the temperature of the gas fed into the gas flow space is controlled, by means of a temperature control mechanism, to be higher than that of the liquid refrigerant dribbling down along the internal surface of the heat receiver base.

* * * * *